US009099915B2

(12) United States Patent
Ge et al.

(10) Patent No.: US 9,099,915 B2
(45) Date of Patent: Aug. 4, 2015

(54) CONGRUENT POWER AND TIMING SIGNALS FOR DEVICE

(75) Inventors: Henry Ge, Shenzhen (CN); Welsin Wang, Shanghai (CN); Xing Zhang, Shanghai (CN)

(73) Assignees: STMICROELECTRONICS (SHENZHEN) R&D CO. LTD, Shenzhen (CN); STMICROELECTRONICS (CHINA) INVESTMENT CO. LTD, Shanghai (CN)

( * ) Notice: Subject to any disclaimer, the term of this patent is extended or adjusted under 35 U.S.C. 154(b) by 395 days.

(21) Appl. No.: 13/335,762

(22) Filed: Dec. 22, 2011

(65) Prior Publication Data

US 2012/0169323 A1     Jul. 5, 2012

(30) Foreign Application Priority Data

Dec. 30, 2010  (CN) .......................... 2010 1 0624752

(51) Int. Cl.
| | |
|---|---|
| *G01R 19/00* | (2006.01) |
| *H02M 7/06* | (2006.01) |
| *G01R 11/40* | (2006.01) |
| *G01R 11/42* | (2006.01) |
| *H02M 1/00* | (2007.01) |

(52) U.S. Cl.
CPC .............. *H02M 7/068* (2013.01); *G01R 11/40* (2013.01); *G01R 11/42* (2013.01); *H02M 2001/0064* (2013.01)

(58) Field of Classification Search
CPC ........ G01R 11/40; G01R 11/42; G01R 11/36; G01R 21/006; G01R 21/127; G01R 31/085; G01R 29/16; G01R 29/18; G01R 15/18; G01R 15/183; G01R 15/181; H02H 3/343; H02H 3/387; H02H 3/34
USPC ........... 324/107, 522, 86, 127, 128, 119, 521; 361/76, 86, 85; 363/89, 44, 84
See application file for complete search history.

(56) References Cited

U.S. PATENT DOCUMENTS

| | | | | | |
|---|---|---|---|---|---|
| 3,727,103 | A | * | 4/1973 | Finch et al. ...................... | 361/30 |
| 3,976,919 | A | * | 8/1976 | Vandevier et al. .............. | 361/96 |
| 4,333,050 | A | * | 6/1982 | Yeasting ........................ | 324/107 |

(Continued)

FOREIGN PATENT DOCUMENTS

| | | |
|---|---|---|
| CN | 2938557 | 8/2007 |
| CN | 101424713 | 5/2009 |
| CN | 202167966 | 3/2012 |

*Primary Examiner* — Huy Q Phan
*Assistant Examiner* — Thang Le
(74) *Attorney, Agent, or Firm* — Allen, Dyer, Doppelt, Milbrath & Gilchrist, P.A.

(57) ABSTRACT

Congruent power and timing signals in a single electronic device. In an embodiment, a circuit may include just one isolation transformer operable to generate a power signal and a timing signal. On the secondary side, two branches may extract both a power signal and a clock signal for use in the circuit on the isolated secondary side. The first branch may be coupled to the transformer and operable to manipulate the signal into a power signal, such as a 5V DC signal. Likewise, the second circuit branch is operable to manipulate the signal into a clock signal, such as a 5 V signal with a frequency of 1 MHz. By extracting both a power supply signal and a clock signal from the same isolation transformer on the secondary side, valuable space may be saved on an integrated circuit device with only having a single winding for a single isolation transformer.

16 Claims, 2 Drawing Sheets

(56) References Cited

U.S. PATENT DOCUMENTS

| | | | |
|---|---|---|---|
| 4,949,030 A * | 8/1990 | Tse | 324/127 |
| 5,652,505 A * | 7/1997 | Brune | 324/107 |
| 6,407,691 B1 | 6/2002 | Yu | |
| 6,519,339 B1 * | 2/2003 | Sacca et al. | 379/412 |
| 7,561,399 B2 * | 7/2009 | Slater et al. | 361/118 |
| 7,973,537 B2 * | 7/2011 | Kalyuzhny et al. | 324/521 |
| 2003/0036864 A1 * | 2/2003 | Randall et al. | 702/79 |
| 2004/0264094 A1 * | 12/2004 | Rahman et al. | 361/115 |
| 2005/0105306 A1 * | 5/2005 | Deng et al. | 363/37 |
| 2006/0164096 A1 * | 7/2006 | Kwon | 324/522 |
| 2006/0232433 A1 * | 10/2006 | Holle et al. | 340/667 |
| 2009/0212759 A1 | 8/2009 | Melanson | |
| 2010/0301837 A1 * | 12/2010 | Higuma et al. | 324/140 R |

* cited by examiner

CONGRUENT POWER AND TIMING SIGNALS FOR DEVICE

PRIORITY CLAIM

The instant application claims priority to Chinese Patent Application No. 201010624752.7, filed Dec. 30, 2010, which application is incorporated herein by reference in its entirety.

BACKGROUND

Systems and devices often rely upon two kinds of signals for operation. A power signal may be used to provide power, logic, and control signals within a system or device. Further, a timing signal or clock signal may also be used to trigger, manipulate or otherwise control various components and circuits of a system or device. Thus, together, these two kinds of signals may be used accordingly.

Often times, a system or device may have the above-described signals provided externally from the system or device. That is, the power signal and/or the clock signal may originate from a circuit outside the system or device. For example, when monitoring overhead power lines, a device for monitoring may draw power directly from the power lines themselves. Similarly, in a device having multiple integrated circuit (IC) chips or multiple separate printed circuit boards (PCB), a single clock source may provide timing signals for all components in a device. Furthermore, these signals, when originating outside of ICs, PCBs, or specific separate devices, may require isolation before being used within these components. As such, both the power signals and the timing signals may require isolating transformers for each kind of signal to provide the isolated signals for use on-chip. Providing two isolating transformers for these two sets of signals is cumbersome and inefficient.

BRIEF DESCRIPTION OF THE DRAWINGS

Embodiments of the subject matter disclosed herein will become more readily appreciated as the same become better understood by reference to the following detailed description, when taken in conjunction with the accompanying drawings.

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

Prior to discussing the specific details of various embodiments, an overview of one embodiment of the subject matter is presented. Electronic circuits may often use two different kinds of signals as discussed above—power signals and clock signals. According to various embodiment discussed below, a single signal may be used to provide both a power signal and a clock signal to a circuit via a single isolation transformer. In one embodiment, an integrated circuit may include just one isolation transformer operable to generate an isolated signal on its secondary side that is proportional to an initial signal received from a signal source. On the secondary side, two branches may then extract both a power signal and a clock signal for use in the circuit on the isolated secondary side. The first branch may be coupled to the transformer and operable to manipulate the signal into a power signal, such as a 5V DC signal. Likewise, the second circuit branch is operable to manipulate the signal into a clock signal, such as a 5 V signal with a frequency of 1 MHz. By extracting both a power supply signal and a clock signal from the same isolation transformer on the secondary side, valuable space may be saved on an integrated circuit device with only having a single winding for a single isolation transformer. These and other aspects of the embodiments are discussed below in greater detail.

Figure 1:
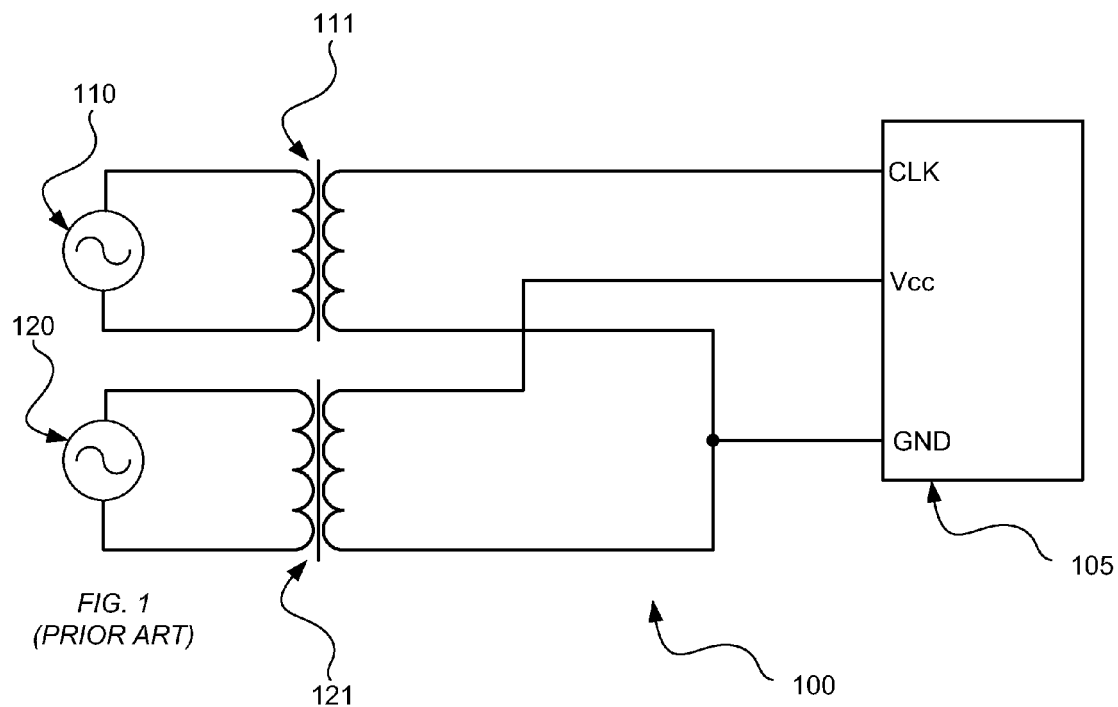
FIG. 1 is a block diagram of a conventional system for providing a power signal and a timing signal to a device using two different isolation transformers.

FIG. 1 is a block diagram of a conventional system for providing a power signal and a timing signal to a device using two different isolation transformers. In this system 100, a clock source 110 (which may be external to the IC, PCB, or device 105) may provide an initial clock signal to the primary side of a first isolation transformer 111. The isolation transformer then translates the signal into a secondary-side signal that be used to provide a clock signal CLK to an IC 105 (hereinafter, reference to an IC 105 is understood to mean an IC, PCB, or other component/device). The secondary side of the first isolation transformer 111 is also coupled to a ground GND.

Similarly, yet separately, a power source 120 (again, possibly external) may provide a power signal to the primary side of a second isolation transformer 121. The second isolation transformer then translates a power signal on its secondary side to provide such the power signal Vcc to the IC 105. As before, the secondary side of the second isolation transformer 121 may also be coupled to the ground GND.

In this manner, both a power signal Vcc and a clock signal CLK are generated external to the IC 105, yet provided to the IC in an isolated manner through the two different isolation transformers 110 and 120. However, with two different isolation transformers 110 and 120, more space is required for the two different transformer windings. Space may be at a premium in smaller and more efficient devices and the requirement for two different sets of transformer windings is a disadvantage. As is described with respect to FIG. 2, however, if the clock signal can be "piggy-backed" onto the power signal, then only a single isolation transformer may be needed.

Figure 2:
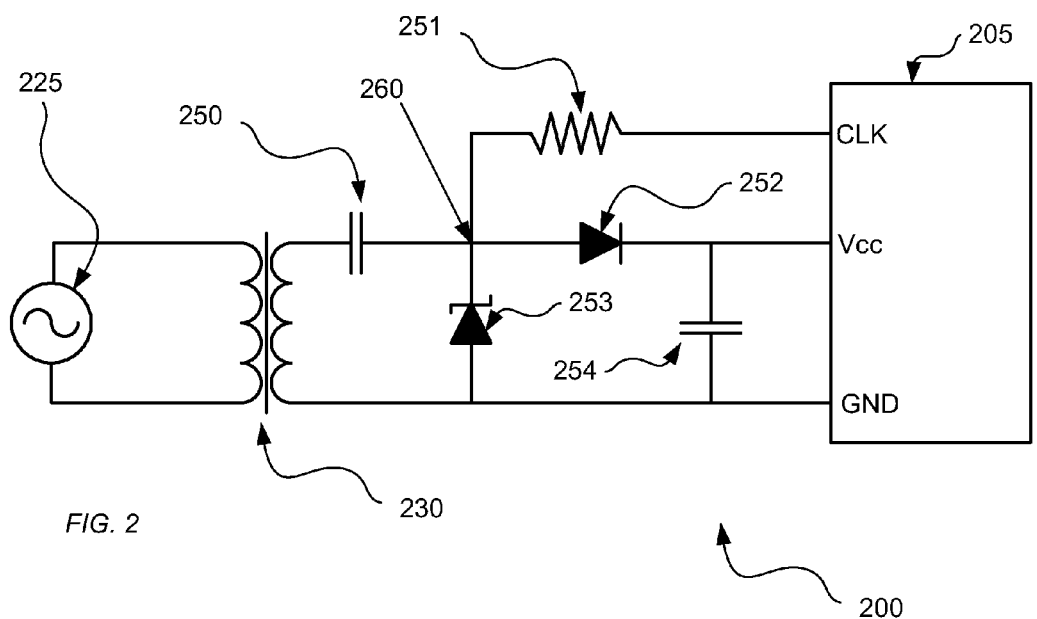
FIG. 2 is a block diagram of a system for providing a power signal and a timing signal to a device using one isolation transformer according to an embodiment of the subject matter disclosed herein.

FIG. 2 is a block diagram of a circuit 200 for providing a power signal and a timing signal to a device using one isolation transformer according to an embodiment of the subject matter disclosed herein. In this embodiment a power/clock source 225 may provide a signal having a specific frequency and amplitude. A suitable frequency may be 1 MHz and a suitable voltage magnitude may be 12 V. Since common power sources may be different (e.g., a North American Standard of 120 V and 60 Hz), such a 12 V, 1 MHz signal may be derived according to conventional solutions for changing the frequency and voltage amplitude of a signal. In this example and the following example below with respect to FIG. 3, the original signal may be a common power line source having an initial frequency of 60 Hz and 240 V. Such conventional manners of manipulating a voltage signal are not discussed in greater detail herein.

The power/clock source 225 provides a signal to the primary side of a single isolation transformer 230. The isolation transformer 230 then generates an almost identical signal at its secondary winding since the isolation transformer has an equivalent number of windings on each side. The initial 12V, 1 MHz signal passes through a filter capacitor 250 to filter out any low-end transients. After this initial filtering, the oscillating (and now filtered) signal may be manipulated in one two ways to deliver either a clock signal to the component 205 or a power signal to the component 205.

In the case of the power signal manipulation, the circuit includes zener diode 253 connected between the output of the filter capacitor and ground GND. The zener diode 253 is sized so as to clamp the magnitude of the voltage of the signal at node 260 to 5 V. The circuit then further includes a rectifying diode 252 that rectifies the clamped signal to provide a DC supply voltage to the Vcc node of the component 205. This DC supply voltage is filtered a second time by filter capacitor 255 to remove any high-frequency transients. Thus, a filtered, rectified, and clamped 5V power signal is delivered to Vcc.

In the case of the clock signal manipulation, the zener diode 253, as described above, clamps the signal at node 260 to 5 V. Node 260 is coupled to the clock input CLK of the component 205 through an impedance 251. This impedance 251 may be sized to further reduce the voltage of the clock signal as it enters the clock node. Further, without any rectification, the frequency of the clock signal will be the same as the frequency of the initial power/clock signal from the secondary winding of the isolation transformer 230.

Such a solution is advantageous because both the clock signal CLK and the power signal Vcc may be derived from a single signal that passes through a single isolation transformer 230. Having only a single isolation transformer 230 reduces the space needed in a device or on an IC or PCB because of the reduced number of windings in the single transformer. When IC space is at a premium, such a reduction in winding space provides a distinct advantage. Thus, the circuit 200 may be part of a larger system as discussed below with respect to FIG. 3.

Figure 3:
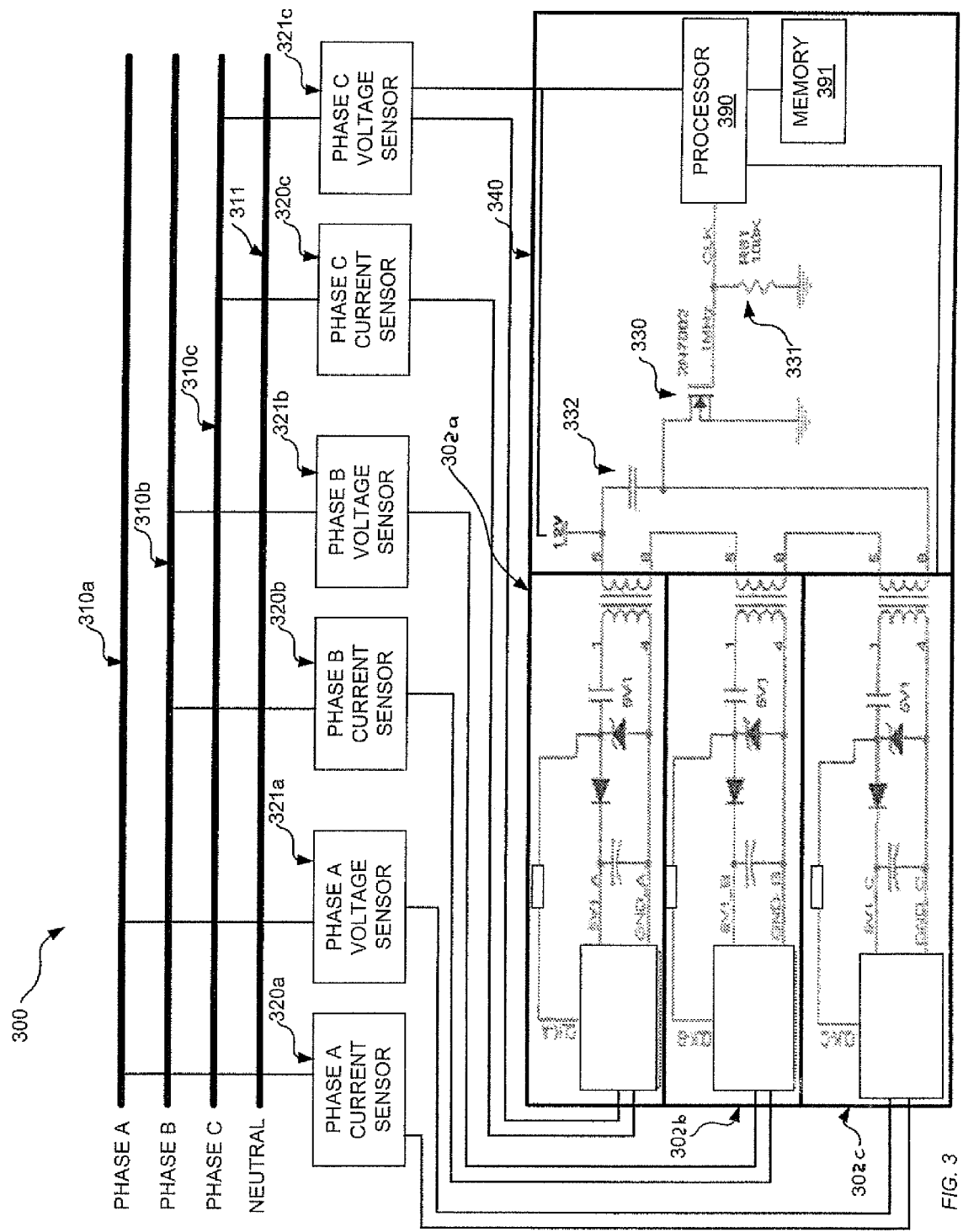
FIG. 3 is a block diagram of a system for providing a power signal and a timing signal to devices of a three-phase power system using one isolation transformer per device according to an embodiment of the subject matter disclosed herein.

FIG. 3 is a block diagram of a system 300 for providing a power signal and a clock signal to measurement devices of a three-phase power system using one isolation transformer per device according to an embodiment of the subject matter disclosed herein. Such a system 300 may be used within the context of a three-phase power distribution system. For example, the system 300 may include a set of power lines having four conductors, phase A 310a, phase B 310b, phase C 310c and a neutral conductor 310n. Often times, it may be useful to know the voltage and current characteristics at any point in time for each of these conductors. Thus, each conductor may be coupled to both a dedicated current sensor 320a-c and a dedicated voltage sensor 321a-c.

In the system of FIG. 3 then, phase A 310a may be coupled to a first voltage sensor 321a and a first current sensor 320a. Similarly, phase B 310b may be coupled to a second voltage sensor 321b and a second current sensor 320b just as phase C 310c may be coupled to a third voltage sensor 321c and a third current sensor 320c. A skilled artisan understands that each of these sensors may include circuitry for generating signals proportional to the voltages and currents on the conductors as handling such large voltages and currents directly may be dangerous. As such, these values are transformed to signals better suited for use in the circuits 301a-c.

In this system 300 embodiment, several devices and/or components may be powered from a single source that may or may not be part of the same circuit and/or IC in the system. Here, there are four different circuits shown in the system 300 of FIG. 3. A first circuit 340 may be used to provide a common power/clock signal to each of the other three circuits 301a-c. Each of these three circuits 301a-c may comprise the circuit 200 shown in FIG. 2. In this manner, each circuit 301a-c may be provided a single power/clock signal such that each circuit only includes one isolation transformer. Further, each of these circuits 301a-c may be coupled to respective currents sensors 320a-c and respective voltage sensors 321a-c to receive measurement signals from the actual conductors 310a-c of the three-phase power system.

The first circuit 340 may be coupled to a voltage source for initially generating a power signal. In one embodiment, this power source may be one of the power lines; as shown, the circuit 340 is coupled to the voltage sensor 321c for Phase C 310c. In other embodiments, this initial power source may be a battery or other suitable power source. The circuit 340 may then manipulate the initial power signal to provide a suitable power/clock signal to the other three circuits 301a-c. Further, the first circuit may include a processor 390 operable to perform calculations based upon data received back from other circuits in the system. Further yet, calculated data may be stored in a memory 391.

Thus, the power/clock signal is initially provided as a clock signal with a frequency of 1 MHz which will have a relatively low magnitude. This signal is conditioned by an impedance 331. So, instead providing this clock signal directly to the three circuits 301a-c, the clock signal is used to drive a switching transistor 330 that switches a 12-volt supply voltage through the primary side of each isolation transformer for each respective circuit 301a-c. Further, a filter capacitor filters out low-frequency transients. In this manner, each circuit is provided with a power/clock signal having a voltage of 12 V and a frequency of 1 MHz.

Such a circuit 340 for generating the power/clock signal may be other configurations. Any circuit that can generate an oscillating signal with a specific voltage magnitude and frequency may be used to generate the power/clock signal. Furthermore, any type of filtering arrangement on the secondary side of each isolation transformer may be used to drive the IC supply voltages. Further yet, any type of separate filtering could be used to recover the clock signal for use at the IC as well.

On particular alternative technique generating a power/clock signal may be a circuit having a feedback signal from the secondary side of each circuit 301a-c. Such a feedback signal would be sent back through the respective isolation transformer, but could then be used to modulate the duty cycle of the initial clock signal. By maintaining the frequency of the initial clock signal (e.g., leading edges of pulses still occur at a 1 MHz frequency), one could modulate the duty cycle to modulate the power delivered (e.g., the length of each pulse could vary).

Within the context of the system of FIG. 3, one could use the three circuits 301a-c for measuring the current and voltage characteristics of each phase 310a-c. Each of these circuits 301a-c may include an IC (such as 205 from FIG. 2) that may be include Sigma Delta modulators that may be used to sense current and voltage on a particular phase of a power supply. So for example, in the case of a three-phase power supply, one could use information garnered from these circuits 301a-c to calculate the entire power usage based on the readings from each phase. Additional information could be garnered from the neutral conductor 310n as well if one were couple a sensor (not shown) here as well.

Each of the circuits 340 and 301a-c as well as the sensors 320a-c and 321a-c may be housed within a single device such as a power meter. Alternatively, the sensors 320a-c and 321a-c may be housed in separate dedicated devices that may be located near the conductors 310a-c, such that only small measurement signals are sent to a separate device housing the additional circuits of the system 300. Further yet, all circuits described in the system of FIG. 3 may be resident on a single IC.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. A metering circuit, comprising:
    a plurality of phase voltage sensors configured to generate a signal proportional to a voltage in a respective phase;
    a plurality of phase current sensors configured to generate a signal proportional to a current in a respective phase;
    a plurality of measurement circuits each coupled respectively to an associated phase voltage sensor and phase current sensor, each measurement circuit comprising
        a transformer operable to generate an isolated signal received from a signal source,
        a first circuit branch coupled to the transformer and configured to manipulate the isolated signal into a clamped power signal, and
        a second circuit branch coupled to the transformer and configured to manipulate the isolated signal into a clock signal.

2. The metering circuit of claim 1 wherein the transformer comprises an isolation transformer having a primary winding and a secondary winding having approximately equal length.

3. The metering circuit of claim 1 wherein the first circuit branch further comprises:
    a zener diode coupled to the transformer and configured to clamp the voltage of the isolated signal to a predetermined maximum voltage;
    a rectifying diode coupled to the transformer and configured to rectify the isolated signal; and
    a filter capacitor coupled to the rectifying diode and configured to remove high-frequency transients from the isolated signal.

4. The metering circuit of claim 3 wherein the predetermined maximum voltage comprises 5 volts.

5. The metering circuit of claim 3, further comprising a low-pass filter coupled to the rectifying diode and configured to attenuate high-frequency transients.

6. The metering circuit of claim 1 wherein the second circuit branch further comprises an impedance configured to reduce the voltage of the isolated signal to a suitable clock signal voltage.

7. The metering circuit of claim 1 wherein the isolated signal comprises a signal having a frequency of 1 MHz and a voltage of 12 volts.

8. The metering circuit of claim 1, further comprising a high-pass filter coupled to the transformer and configured to attenuate low-frequency transients.

9. A three-phase metering system, comprising:
    at least three phase voltage sensors configured to generate a signal proportional to a voltage in a respective phase;
    at least three phase current sensors configured to generate a signal proportional to a current in a respective phase; and
    at least three measurement circuits coupled respectively to an associated phase voltage sensor and a phase current sensor, each measurement circuit comprising
        a transformer configured to generate an isolated signal received from a signal source,
        a first circuit branch coupled to the transformer and configured to manipulate the isolated signal into a power signal, and
        a second circuit branch configured to manipulate the isolated signal into a clock signal.

10. The metering system of claim 9, further comprising a signal generation circuit configured to generate a power/clock signal having a frequency and a voltage.

11. The metering system of claim 10 wherein the power/clock signal comprises a frequency of 1 MHz and a voltage of 12 volts.

12. The metering system of claim 10 wherein the signal generation circuit comprises:
    a signal input configured to receive a power signal having a first frequency, a first voltage, and a first current;
    an impedance coupled to the input and configured to condition the power signal to have a second current;
    a switch coupled to the input and configured to generate a switched power signal having a frequency equal to the frequency of the power signal, the switch controlled by the power signal; and
    a filter coupled to the switch and configured to attenuate low-frequency transients; and
    an output node coupled to the filter.

13. The metering system of claim 12, wherein the switch comprises a MOSFET transistor.

14. The metering system of claim 12, wherein the filter comprises a capacitor.

15. The metering system of claim 12 wherein the output node of the signal generation circuit is coupled to the primary winding of each transformer in each respective measurement circuit.

16. The metering system of claim 9, further comprising:
    a processor coupled to each respective measurement circuit and configured to control each measurement circuit; and
    a memory coupled to the processor and configured to store data calculated by each respective measurement circuit.

* * * * *